United States Patent
Schadt et al.

(10) Patent No.: US 9,593,823 B2
(45) Date of Patent: Mar. 14, 2017

(54) OPTOELECTRONIC MODULE WITH IMPROVED OPTICAL SYSTEM

(75) Inventors: Susanne Schadt, Langenselbold (DE); Michael Peil, Otzberg (DE); Harald Maiweg, Korschenbroich (DE)

(73) Assignee: Heraeus Noblelight GmbH, Hanau (DE)

( * ) Notice: Subject to any disclaimer, the term of this patent is extended or adjusted under 35 U.S.C. 154(b) by 0 days.

(21) Appl. No.: 14/232,302

(22) PCT Filed: Jul. 5, 2012

(86) PCT No.: PCT/EP2012/002819
§ 371 (c)(1),
(2), (4) Date: Jan. 13, 2014

(87) PCT Pub. No.: WO2013/010634
PCT Pub. Date: Jan. 24, 2013

(65) Prior Publication Data
US 2015/0036114 A1 Feb. 5, 2015

(30) Foreign Application Priority Data
Jul. 18, 2011 (DE) .................. 10 2011 107 893

(51) Int. Cl.
*F21V 5/00* (2015.01)
*H01L 25/075* (2006.01)
(Continued)

(52) U.S. Cl.
CPC ........ *F21V 5/007* (2013.01); *B29D 11/00807* (2013.01); *F21V 7/0083* (2013.01);
(Continued)

(58) Field of Classification Search
CPC combination set(s) only.
See application file for complete search history.

(56) References Cited

U.S. PATENT DOCUMENTS 7,598,532 B2  10/2009  Fujita et al.
8,148,746 B2   4/2012  Kobayakawa
(Continued)

FOREIGN PATENT DOCUMENTS

CN   101523620 A   9/2009
CN   101749592 A   6/2010
(Continued)

OTHER PUBLICATIONS

Int'l Search Report issued Oct. 30, 2012 in Int'l Application No. PCT/EP2012/002819.
(Continued)

*Primary Examiner* — Kyoung Lee
*Assistant Examiner* — Ratisha Mehta
(74) *Attorney, Agent, or Firm* — Panitch Schwarze Belisario & Nadel LLP

(57) ABSTRACT

The invention relates to an optoelectronic module (112), more particularly to an optoelectronic chip-on-board module (114). The optoelectronic module (112) comprises a substrate (116), wherein the substrate (116) has a planar design. Furthermore, the optoelectronic module (112) comprises a plurality of optoelectronic components (118) that are arranged on the substrate (116). The optoelectronic module (110) further comprises at least one optical system (120) applied onto the substrate (114), more particularly a microoptical system having a plurality of microoptical elements. The optical system (120) comprises at least one primary optical system (124) that is adjacent to the optoelectronic components (116) and at least one secondary optical system (138).

10 Claims, 5 Drawing Sheets

(51) Int. Cl.
  *B29D 11/00* (2006.01)
  *F21V 7/00* (2006.01)
  *H01L 33/54* (2010.01)
  *B29K 83/00* (2006.01)
  *F21Y 101/00* (2016.01)

(52) U.S. Cl.
  CPC .... *H01L 25/0753* (2013.01); *B29K 2083/005* (2013.01); *F21Y 2101/00* (2013.01); *H01L 33/54* (2013.01); *H01L 2924/0002* (2013.01); *Y02E 10/52* (2013.01)

(56) References Cited

U.S. PATENT DOCUMENTS

| | | | |
|---|---|---|---|
| 2004/0184270 A1 | 9/2004 | Halter | |
| 2005/0179041 A1* | 8/2005 | Harbers | H04N 9/315 257/80 |
| 2006/0044803 A1 | 3/2006 | Edwards | |
| 2007/0045761 A1* | 3/2007 | Basin | H01L 24/97 257/440 |
| 2007/0069230 A1* | 3/2007 | Yu | 257/98 |
| 2007/0228392 A1* | 10/2007 | Plank | H01L 25/0753 257/79 |
| 2007/0257272 A1* | 11/2007 | Hutchins | 257/98 |
| 2008/0137331 A1 | 6/2008 | Kaneko et al. | |
| 2010/0072496 A1* | 3/2010 | Kobayakawa | H01L 25/0753 257/91 |
| 2011/0006331 A1* | 1/2011 | Shaikevitch | H01L 33/507 257/98 |

FOREIGN PATENT DOCUMENTS

| | | | | |
|---|---|---|---|---|
| JP | 2005294786 A | 10/2005 | | |
| JP | 2010272858 A | 12/2010 | | |
| JP | 2011114222 A | 6/2011 | | |
| JP | 2011138982 A | 7/2011 | | |
| NL | WO 2010106504 A1 * | 9/2010 | ........... | H01L 33/504 |
| WO | 02/05351 A1 | 1/2002 | | |
| WO | 2004/032235 A2 | 4/2004 | | |
| WO | 2005073621 A1 | 8/2005 | | |
| WO | 2005/101535 A2 | 10/2005 | | |
| WO | 2009/063382 A1 | 5/2009 | | |

OTHER PUBLICATIONS

Office Action Issued Mar. 26, 2012 in Germany Appln. Ser. No. 10 2011 107 893.6.
English translation of Office Action issued Feb. 22, 2015 in KR Application No. 10-2014-7003969.
English translation of Office Action issued Aug. 27, 2015 in KR Application No. 10-2014-7003969.
English translation of Office Action issued Feb. 1, 2016 in CN Application No. 201280035515.4.
English translation of Office Action issued Jan. 20, 2016 in KR Application No. 1020147003969.
Office Action and Decision to Reject an Amendment issued May 1, 2016 in KR Application No. 10-2014-7003969.
Office Action and Reason for Refusal issued Jul. 19, 2016 in JP Application No. 2014-520556.
Office Action issued Aug. 2, 2016 in KR Application No. 10-2014-7003969.
Office Action issued Oct. 8, 2016 in CN Application No. 201280035515.4.

\* cited by examiner

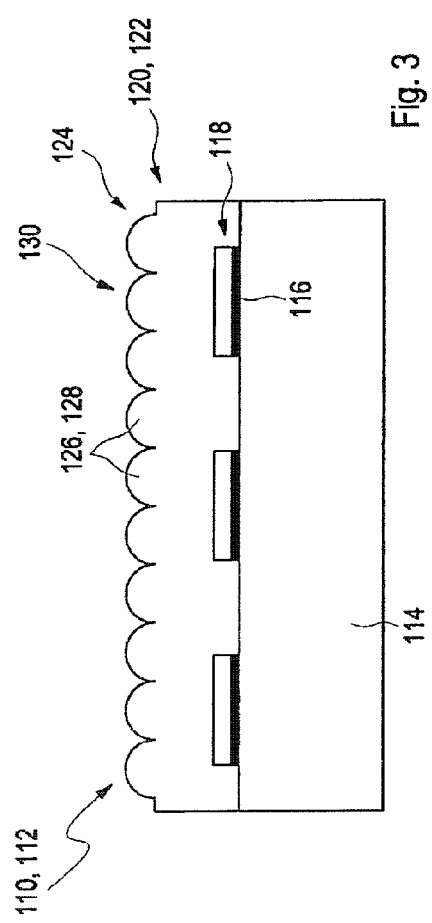
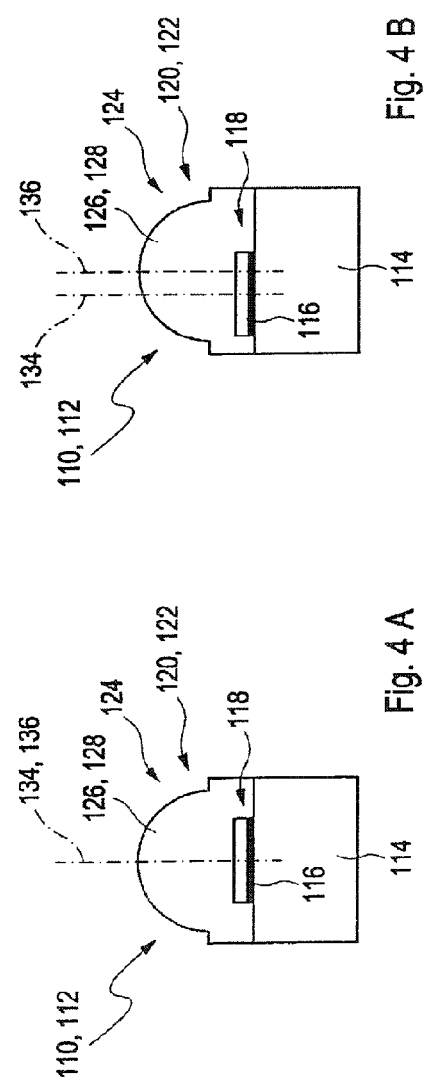

OPTOELECTRONIC MODULE WITH IMPROVED OPTICAL SYSTEM

CROSS-REFERENCE TO RELATED APPLICATIONS

This application is a Section 371 of International Application No. PCT/EP2012/002819, filed Jul. 5, 2012, which was published in the German language on Jan. 24, 2013, under International Publication No. WO 2013/010634 A1 and the disclosure of which is incorporated herein by reference.

BACKGROUND OF THE INVENTION

The invention relates to an optoelectronic module, an optoelectronic device, a method for manufacturing an optoelectronic module, as well as a use of an optoelectronic module. Such optoelectronic modules, optoelectronic devices, methods and uses can be employed in natural sciences, technology, medicine and daily life in various manners. An important field of application to which the invention, however, is not limited, is its use in the field of process technology, for example, for the purpose of drying and/or hardening materials and/or objects or for the purpose of a photochemical modification of workpieces. As an alternative or in addition, optoelectronic modules and optoelectronic devices of the type described below can, for example, also be used in the field of illumination, for example, in traffic engineering and/or in building services.

In particular, the invention relates to optoelectronic modules which are designed as what are called chip-on-board modules, either as a whole or in part. Such chip-on-board modules are modules which can be manufactured according to what is called chip-on-board technology (CoB), either as a whole or in part. According to chip-on-board technology, one or more unhoused semiconductor components (semiconductor chips) are directly mounted to a substrate, for example, a printed circuit board or another type of interconnect device. In general, the term of chip-on-board module therefore relates to an electronic assembly which includes at least one substrate as well as at least one unhoused (naked) semiconductor component mounted to a substrate. For example, such chip-on-board modules are used as luminous elements, as high-performance lamps (for example, as high-performance UV LED lamps), as photovoltaic modules, as sensors, or in any other manner. In particular, the optoelectronic modules suggested are optoelectronic chip-on-board modules having a plurality of optoelectronic components. Within the scope of the present invention, the optoelectronic components used therein may, for example, however not exclusively, be light-emitting diodes (LEDs) and/or photodiodes, particularly in the form of chips or other components, which are arranged in the chip-on-board module on a planar substrate, more particularly a substrate made of metal, ceramic or silicon, a metal-core or FR4 printed circuit board, a glass substrate, a plastic substrate, a metal matrix compound material, or similar substrates. These chip-on-board modules must be protected against mechanical damage and corrosion. To achieve this, it is tried to find solutions that are as compact and simple as possible.

Since, usually, protection in the form of housings on chip-on-board modules is complex in terms of costs and technology, planar potting of all or a plurality of components with a plastic-based potting material is known as practical prior-art alternative for protecting such chip-on-board modules. Along with other functional components, such as solder tracks and contacting elements, the optoelectronic components in chip-on-board modules, together with a planar substrate, can be protected against mechanical damage and corrosion by means of coatings.

Furthermore, a directivity of the optoelectronic modules plays an important role for many applications. For optoelectronic components, directivity generally describes an angular dependence of the strength of waves received or transmitted, which is usually related to a sensitivity and/or intensity in a main direction, i.e., along an optical axis of the optoelectronic components. In particular, a radiation intensity and/or a directional characteristic of the optoelectronic module usually plays an important role in optoelectronic modules which comprise one or more light-emitting diodes as optoelectronic components. This directional characteristic is a special from of the directivity and, in this case, describes the angular dependence of the electromagnetic field and/or the intensity of the electromagnetic waves emitted, in particular in the form of infrared, ultraviolet or visible light. Chip-on-board modules are to advantage in that light-emitting diodes can be applied onto the substrate with a high packaging density, this increasing the radiation intensity. In many cases, however, an additional optical system is used to influence the directional characteristic of the optoelectronic modules. For light-emitting optoelectronic modules as well as for photosensitive optoelectronic modules, this optical system can, for example, be one or more lens systems, for example what are called microlens systems. The lens systems can comprise one or more beam-forming elements the lateral extension of which can be in the sub-millimeter range to the decimeter range. In the optically active ranges of these microlens systems, there may, for example, be structures in the sub-millimeter range.

Due to the fact that the distances required between the optoelectronic components are short, more particularly due to the short pitch (centre-to-centre distance between neighboring optoelectronic components) typically used in chip-on-board modules, there are only a few known methods allowing the implementation of beam-forming microlenses above the individual optoelectronic components, for example, the individual light-emitting diodes of an array of light-emitting diodes, for example by means of an appropriate potting material.

For example, the post-published document, DE 10 2010 044 470, from the house of the Applicant of the present application describes a method for coating an optoelectronic chip-on-board module which comprises a planar substrate fitted with one or more optoelectronic components. Therein, use is made of a transparent UV- and temperature-resistant coating consisting of one or more silicones. According to the method, the substrate to be coated is pre-heated to a first temperature. Furthermore, a bank is applied which encloses an area or partial area to be coated of the substrate. This bank, as a whole or in part, is composed of a first thermally hardening, highly reactive silicone which hardens at a first temperature. This first silicone is applied to the pre-heated substrate. Furthermore, the area or partial area of the substrate that is enclosed by the bank is filled with a liquid second silicone, and the second silicone is hardened. Therein, it is also possible to apply quickly hardening lenses onto individual components of the substrate, particularly by means of the first silicone. In this manner, it is also possible to form microlens systems.

Furthermore, a method for coating an optoelectronic chip-on-board module is known from the likewise post-published document, DE 10 2010 044 471, that is also originating from the house of the Applicant of the present application. Again, the optoelectronic chip-on-board module comprises a planar substrate which is fitted with one or more optoelectronic components and includes a transparent UV- and temperature-resistant coating consisting of silicone. The method comprises a method step of potting a liquid silicone into a mould that is open at the top and comprises outside dimensions that correspond to the outside dimensions of the substrate or are in excess thereof. Furthermore, the substrate is introduced into the mould wherein the optoelectronic component or the optoelectronic components completely immerse(s) into the silicone. In a further method step, the silicone is hardened and cross-linked with the optoelectronic components and the substrate. Furthermore, the substrate provided with the coating consisting of the hardened silicone is removed from the mould.

Furthermore, an LED array which comprises a lens array for converging divergent light from each LED is known from U.S. Pat. No. 7,819,550 B2. The lenses each comprise a flat section and two curved sections. The lenses are not curved above the light-emitting diodes.

A method for manufacturing a white-light LED is known from US 2007/0045761 A1. Therein, use is made of an LED which emits blue light and use is made of phosphoruses which convert the light. Among other things, said document also describes the formation of optical systems above the light-emitting diodes, which are produced by means of a casting process that provides a seal against the atmosphere.

Furthermore, a method for encapsulating light-emitting diodes by means of a compression casting method is known from US 2010/0065983 A1. Therein, use is made of a tape for sealing during the casting process.

As a matter of principle, it is furthermore known to use reflectors as optical components. For example, U.S. Pat. No. 7,638,808 describes the use of microreflectors for LED arrays. Therein, use is made of a substrate which has cavities into which LEDs are inserted. Lateral walls of these individual cavities serve as reflector which can be adjusted in its design. The document also describes the use of an additional beam-forming potting process to close the cavities.

Despite the improvements described above and achieved for known optoelectronic modules, there is still a demand for optoelectronic modules with an improved directivity, more particularly a demand for optoelectronic modules with a high radiation intensity for specific applications. In particular, there is a demand for efficient light sources that can be mounted side by side and the lighting profile of which may have a high radiation intensity at an adjustable distance, wherein high homogeneity requirements are met at the same time and a sufficiently steep drop can be registered in the edge region. Such optoelectronic modules, more particularly modules of light-emitting diodes, are required for lithographic applications in the industrial production of the printing industry in order to reach a uniform and high-quality drying image of print colors and inks. High radiation intensities, for example, radiation intensities that are usually in excess of 100 $mW/cm^2$, typically 1-20 $W/cm^2$, up to 100 $W/cm^2$, are usually required for reaching high process velocities with light sources that are as compact and energy-efficient as possible.

BRIEF SUMMARY OF THE INVENTION

It is therefore the object of the present invention to provide an optoelectronic module which obviates the drawbacks of known methods at least to a large extent and which meets the aforementioned requirements at least to a large extent. In particular, it is the object of the present invention to provide an optoelectronic module which, when configured as a light-emitting module, comprises a high efficiency and radiation intensity, which can be used as a side-by-side-mounting light source, and which comprises a lighting profile having a high homogeneity and, preferably, a sufficiently steep drop in an edge region.

This problem is solved by an optoelectronic module, an optoelectronic device, a method, and a use with the features of the independent claims. Advantageous refinements of the invention, which can be implemented alone or in combination, are presented in the dependent claims.

An optoelectronic module is suggested according to a first aspect of the present invention. In general, an optoelectronic module is to be understood as an assembly which can be handled as a unit and which comprises at least one optoelectronic component, for example, a light-emitting electronic component and/or a light-sensitive electronic component. The optoelectronic module can, in particular, be designed as an optoelectronic chip-on-board module according to the definition mentioned above.

The optoelectronic module comprises a substrate that has a planar design. Within the general scope of the present invention, a substrate is to be understood as an element that is established to receive one or more electronic, more particularly one or more optoelectronic, components. In particular, the substrate can be designed according to the type described above with regard to the state of the art and can comprise one or more interconnect devices, more particularly according to the type mentioned. A planar design is to be understood as a design in which at least one surface that can be fitted with the optoelectronic component, more particularly an unhoused chip, for example a flat or a slightly curved surface onto which one or more optoelectronic components, more particularly one or more optoelectronic chips without housing, can be applied. For example, the planar substrate can be designed flat as a whole or in part, for example, as a printed circuit board.

Furthermore, the optoelectronic module comprises a plurality of optoelectronic components that are arranged on the substrate. In particular, these optoelectronic components can be arranged on the substrate in chip-on-board technology. Optoelectronic components, as described above, are to be understood as components which fulfill at least one optoelectronic function, for example, a light-emitting and/or light-sensitive function. In particular, the optoelectronic components can be selected from the group consisting of light-emitting diodes and photodiodes. The optoelectronic components can, in particular, comprise one or more unhoused chips. Accordingly, the plurality of optoelectronic components can, in particular, comprise an array of optoelectronic components, i.e., an arrangement in which a plurality of optoelectronic components are applied onto the substrate in one or more rows. For example, the array can comprise a rectangular matrix with at least one row and/or at least one column or with a plurality of rows and columns. Therein, a row and/or column is to be understood as a linear arrangement of at least two, preferably at least three, four or more optoelectronic components. That means that the plurality of optoelectronic components can, preferably, comprise a rectangular matrix of light-emitting diodes and/or photodiodes. As a matter of principle, however, other embodiments are also feasible, for example, embodiments in which the plurality of optoelectronic components is irregularly arranged on the substrate and/or is arranged on the substrate in a non-rectangular matrix.

Furthermore, the optoelectronic module comprises at least one optical system applied onto the substrate. The optical system can comprise one or more optical elements. In particular, said optical system can be a microoptical system having a plurality of microoptical elements. In general, the optical elements can comprise lateral extensions from the sub-millimeter range to the decimeter range. The complete optical system which can comprise several optical elements up to a plurality of such optical elements can have a lateral dimension, for example, a diameter or an equivalent diameter in a plane of the substrate, from the sub-millimeter range up to a range of one or more meters. The optical system comprises at least one primary optical system that is adjacent to the optoelectronic components and at least one secondary optical system.

Within the scope of the present invention, an optical system is, therein, generally to be understood as an element which has a converging and/or collimating and/or scattering effect on a light beam. This at least one element of the optical system is also referred to as optical element. For example, an optical system can comprise at least one lens, for example, at least one microlens. As has been described above, the lens can generally have lateral extensions, for example, from the sub-millimeter range up to the decimeter range. The at least one lens can, for example, comprise at least one converging lens and/or at least one scattering lens and/or at least one reflector, for example, a mirror having a converging and/or scattering effect.

Accordingly, a primary optical system is to be understood as an optical system which directly adjoins the at least one optical component on a light path, with the result that light exiting from the optoelectronic component directly enters into the primary optical system or with the result that light entering into the optical component passes the primary optical system immediately before it enters into the optoelectronic component. The primary optical system can comprise one or more primary optical elements. For example, the primary optical system can comprise one or more lenses, more particularly microlenses, which directly rest upon the at least one optoelectronic component or into which the optoelectronic component is embedded as a whole or in part. As an alternative or in addition, the primary optical system can comprise one or more reflectors which reflect and, therein, collimate or scatter the light exiting from the optoelectronic component, or which collimates or scatters the light entering into the optoelectronic component. That means that the term of primary optical system characterizes at least one beam-forming element which is adjacent to the optoelectronic component on a light path without any further optical components being arranged between the primary optical system and the optoelectronic component, wherein the term of primary optical system is used irrespective of whether or not there are further optical systems, more particularly secondary optical systems.

Accordingly, a secondary optical system is to be understood as an optical system which is arranged in the optoelectronic chip-on-board module such that, on a light path between the secondary optical system and the at least one optoelectronic component, the light must pass at least one further optical system, i.e. at least one further optical element. For example, light exiting from the optoelectronic component can initially pass a primary optical system before the light passes a secondary optical system. As an alternative, light entering into the optoelectronic component can initially pass the secondary optical system and then the primary optical system, before the light finally enters into the optoelectronic component. The secondary optical system can comprise one or more secondary optical elements, for example, one or more reflectors and/or one or more lenses.

For example, the at least one primary optical system can comprise at least one lens, more particularly a plurality of lenses, more particularly microlenses. For example, the optoelectronic chip-on-board module can comprise a plurality of optoelectronic components which are arranged in a matrix and/or an array, for example, an array of light-emitting diodes and/or an array of photodiodes. This plurality of optoelectronic components can have a plurality of elements of a primary optical system assigned to it, for example such that each optoelectronic component or group of optoelectronic components has exactly one component of the primary optical system and/or one defined group of components of the primary optical system assigned to it. For example, exactly one lens can rest on each optoelectronic component, or a common lens for a group of optoelectronic components can rest on this group, or an optoelectronic component can have a group of lenses assigned to it. Examples will be illustrated in more detail below.

For example, the at least one secondary optical system can comprise at least one reflector and/or at least one lens. For example, elements of the secondary optical system can, again, be assigned to optoelectronic components, for example by each element or group of elements of an array of the optoelectronic components again having one or more elements of the secondary optical system assigned to it. For example, the secondary optical system can comprise at least one lens and/or at least one reflector, for example a plurality of concave mirrors which can, for example, be arranged in a matrix and/or an array. For example, each concave mirror can have an optoelectronic component and/or a group of optoelectronic components assigned to it, for example by the optoelectronic component being arranged within the concave mirror as a whole or in part. Examples will be illustrated in more detail below.

In a preferred embodiment, the primary optical system is selected from the group consisting of a lens system, more particularly a microlens system and most preferably a lens array; a reflector system, more particularly a microreflector system and most preferably a reflector system having a plurality of depressions with reflecting surfaces, wherein one or more of the optoelectronic components are introduced into each of the depressions. Within the scope of the present invention, "micro" is used as an expression for elements which comprise one or more optically active areas, for example diffracting, scattering, collimating, converging or diffusing areas having a lateral extension in the sub-millimeter range. However, the total lateral extension of the elements can be in the sub-millimeter range up to the meter range.

In particular, the secondary optical system can comprise one or more secondary optical elements which can be selected from the group consisting of a reflector and a lens. If a plurality of secondary optical elements is provided, these can be arranged particularly in an array, as has already been described above. Within the scope of the present invention, array and matrix are terms which are used synonymously, at least to a large extent. At least one secondary optical element can be assigned to an optoelectronic component or to a group of optoelectronic components.

Within the scope of the present invention, an assignment of an optical element to an optoelectronic component or vice versa is, therein, generally understood as a spatial arrangement which is such that light exiting from the optoelectronic component passes the assigned optical element or that light entering into the optoelectronic component passes the optical element before entering. In particular, this assignment can be designed spatially such that the optical element is arranged above or below the assigned optoelectronic component.

In a potential embodiment, the secondary optical system can comprise a secondary optical element which is assigned to a plurality of optoelectronic components, more particularly to a plurality of optoelectronic components and assigned primary optical components. For example, a reflector and/or a lens of the secondary optical system can be assigned to a plurality of optoelectronic components. The optoelectronic module can comprise a plurality of such secondary optical elements, with a plurality of optoelectronic components being assigned to each of said secondary optical elements. For example, these secondary optical elements can be arranged in an array.

In particular, the at least one secondary optical element can comprise a reflector having a depression with reflecting surfaces, wherein the at least one optoelectronic component assigned to the secondary optical element is introduced into the depression as a whole or in part. In addition to the optoelectronic components, at least one primary optical element assigned to the optoelectronic components can be introduced into the depression as a whole or in part. For example, the optoelectronic components can each comprise one or more lenses as primary optical elements, wherein the group of the optoelectronic components and the assigned primary optical elements are, for example, introduced into the depression of the secondary optical element. A plurality of such secondary optical elements can be provided on the optoelectronic module, for example in the form of an array of a plurality of such depressions.

As an alternative or in addition to at least one reflector, the at least one secondary optical element can comprise a lens. If one optoelectronic component or a plurality of optoelectronic components is assigned to the secondary optical element, the lens can, therein, for example cover the assigned optoelectronic components. In addition, at least one primary optical element assigned to the optoelectronic components can be covered by the lens. A plurality of such secondary optical elements can again be provided on the optoelectronic module, for example in the form of an array of a plurality of such lenses.

In particular, the optoelectronic module can be designed such that the optoelectronic components are arranged in a one-dimensional or two-dimensional array. Accordingly, the optical elements of the primary optical system and/or optical elements of the secondary optical system can also be arranged in a one-dimensional or two-dimensional array. This array can, for example, comprise the same pitch in one or two dimensions as the array of the optoelectronic components. Therein, a pitch is understood as a spacing between centre points of neighboring cells of the array in one dimension, for example a spacing between centre points of neighboring optoelectronic components. As an alternative or in addition to an identical pitch in one or two dimensions, the pitch of the array of the optical elements of the primary optical system and/or the secondary optical system can, for example, also be an integer multiple or an integer divisor of the pitch of the array of the optoelectronic components in one or two dimensions. Other refinements are feasible as well.

In particular, the primary optical system can comprise a plurality of primary optical elements, wherein one optoelectronic component or a group of optoelectronic components of the array is assigned to a primary optical element or a group of primary optical elements. In particular, one primary optical element can be assigned to each optoelectronic component. In particular, the optoelectronic component and the primary optical element can each comprise an optical axis, wherein the optical axes can be aligned with each other in a manner selected from the group consisting of: the optical axes coincide; the optical axes are offset in parallel to each other; the optical axes are slanted in relation to each other. In particular, the alignment of the optical axes can vary within the array, with the result that, for example, pairs of optoelectronic components and assigned primary optical elements are provided within an array, wherein there is a first alignment of the optical axis in at least one first pair and there is a second alignment which differs from the first alignment in at least one second pair.

If the primary optical elements are arranged in an array, a directivity of the primary optical elements within the array can, in particular, be constant or it can also be varying. Within the scope of the present invention, directivity can, therein, generally be understood as an angular dependence of received or transmitted electromagnetic waves, more particularly light in the visible and/or infrared and/or ultraviolet spectral range. For example, this angular dependence can refer to the electromagnetic field of the electromagnetic waves. As an alternative or in addition, the angular dependence can, for example, also refer to an intensity and/or an energy density and/or another physical variable characterizing the strength of the electromagnetic waves. For example, the directivity can be specified with reference to a strength in a main direction which is, for example, parallel to an optical axis of the optoelectronic component, for example an axis which drives through a sensitive and/or emitting active surface of the optoelectronic component in a vertical and centric manner. In particular, the directivity can comprise a directional characteristic if the optoelectronic module comprises one or more optoelectronic components in the form of light-emitting components, for example light-emitting diodes. For example, the directional characteristic can be measured by means of an appropriate sensor which is arranged at a variable angle and at a predetermined distance in front of the optical element and/or the optoelectronic component, wherein continuous or discontinuous measurements of a strength of the emission, for example measurements of an intensity, are taken at different angles. In this manner, it is, for example, possible to register directivities by means of appropriate polar diagrams of the measurements. Such measuring methods are known to persons skilled in the art from the field of lighting technology. As a matter of principle, the precise embodiment of the method used is, therein, of no importance for the present invention because nothing but a comparison of the directivities of the microlenses is made.

A directivity of an optical element, for example a lens, more particularly a microlens, can, in particular, be understood as a directivity of the optical element in cooperation with an optoelectronic component, for example a light-emitting diode, assigned to the optical element. As has been described above, the optical elements can, in particular, each be assigned to one or more optoelectronic components of the plurality of optoelectronic components, with the result that, for example, exactly one lens of the primary optical system is arranged above each optoelectronic component. Accordingly, a directivity of the primary optical element is then to be understood as the directivity of the group that is composed of the optoelectronic component as well as the assigned primary optical element.

The directivities of the primary optical elements can differ from each other, for example, with regard to an opening angle, for example with regard to an emission angle. For example, an emission angle can be understood as an angle which is enclosed by the lateral points with half of the maximum light intensity. It is, however, also possible to use other characteristics of the directivity for comparing the directivities.

In particular, the array of primary optical elements can comprise at least two primary optical elements the directivities of which differ from each other. For example, the at least two primary optical elements the directivities of which differ from each other can be arranged in an interior region of the array, for example of a lens array of the primary optical system, and at an edge of the array, for example of the lens array. For example, the primary optical system can comprise a lens array and, more particularly, a microlens array in the form of a one-dimensional or a two-dimensional matrix of lenses, for example microlenses. For example, lenses that are arranged at an edge of the lens array can, therein, comprise a different directivity than lenses that are arranged in an interior region of the lens array. In the case of a linear matrix, this edge can, for example, each consist of the outermost lenses. In the case of a two-dimensional matrix, the edge can comprise a line or a frame of lenses which are arranged at the edge of the lens array. These edges can differ from at least one lens which is arranged in the interior region of the lens array, i.e. aside the edge, with regard to their directivities. Therein, the lenses of the lens array can be designed such that at least two groups of lenses are provided, wherein the lenses of at least one first group comprise a first directivity and wherein the lenses of the at least one second group comprise at least one second directivity, wherein the first directivity and the second directivity differ from each other. Therein, the lens system can comprise a stepwise change in the directivities, with the result that, for example, the directivities continuously or discontinuously change from an interior region of the lens system towards an edge of the lens system. Therein, two or more steps of the change can be provided.

If the primary optical system comprises a plurality of reflectors, for example microreflectors, the directivities can be designed in an analogous manner. What has been said above with regard to the lenses, is then applicable in analogy for the reflectors, with the result that the primary optical system can again comprise, for example, at least two reflectors with different directivities.

In particular, the optoelectronic module can be designed such that the optoelectronic components, more particularly an array of the optoelectronic components, are spaced apart from an edge of the substrate by no more than 10 mm, more preferably by no more than 5 mm and most preferably by no more than 3 mm. This also applies accordingly to the optical elements of the optical system, for example for the optical elements of the primary optical system and/or the at least one optical element of the secondary optical system. Preferably, these optical elements can also be spaced apart from the edge of the substrate by no more than 10 mm, more preferably by no more than 5 mm and most preferably by no more than 3 mm. This spacing allows, for example, mounting a plurality of optoelectronic modules side by side to obtain an optoelectronic device, for example in one or two dimensions, with the result that, at the transition between the optoelectronic modules, there will be no gap or only a minor gap between the optoelectronic components of neighboring modules.

Accordingly, an optoelectronic device is suggested according to another aspect of the present invention. The optoelectronic device comprises a plurality of optoelectronic modules according to the invention, which are mounted side by side in one or two spatial directions. For example, this side-by-side mounting can be made in one plane, with the result that, for example, the substrates of the optoelectronic modules are arranged in one plane wherein, for example, light can be emitted in the same emission direction. For example, the optoelectronic device can be designed as a light source, either as a whole or in part. Other refinements are feasible as well. Apart from the optoelectronic modules that are mounted side by side, the optoelectronic device can, furthermore, comprise one or more additional components, for example an activation unit and/or a housing wherein the housing, for example, encloses the optoelectronic modules as a whole or in part.

Another aspect of the present invention proposes a method for the manufacture of an optoelectronic module according to the invention. As regards possible embodiments of the optoelectronic module, reference can be made to the above description or also to the exemplary embodiments that will still be described in more detail below. According to the method, the optical system is manufactured at least in part such that, particularly using a casting method, at least one formable starting material of the optical system can be brought into contact with the optoelectronic components and then molded and hardened. In this manner, it is particularly possible to manufacture the at least one primary optical system and/or the at least one secondary optical system, either as a whole or in part, by means of the at least one formable starting material. In this manner, it is for example possible to manufacture a lens array of the primary optical system and/or one or more lenses, for example again a lens array, of the secondary optical system by means of the formable starting material. Herein, use can, for example, be made of one or more unpressurised or pressurized casting methods, particularly by means of at least one mould which forms the optical system, for example the primary optical system and/or the secondary optical system. As a matter of principle, one or more plastic materials which are, for example, transparent or can be hardened can, in particular, be used as formable starting material. Examples that can be mentioned here are epoxides and/or silicones. As a matter of principle, however, other materials can also be used.

The proposed method for the manufacture of the optoelectronic module essentially allows utilizing known methods to manufacture the optoelectronic module or parts thereof, for example the optical system or parts thereof. For example, the known prior-art methods described above can be utilized to manufacture the primary optical system and/or the secondary optical system. In particular, the methods described in DE 10 2010 044 470 and/or in DE 10 2010 044 471 can be utilized to manufacture an optoelectronic module according to the present invention or parts thereof, for example the primary optical system and/or the secondary optical system. Within the scope of the present invention, full reference is accordingly made to these manufacturing methods.

For example, use can be made of a method in which the substrate is initially pre-heated to a first temperature. Subsequently, at least one bank consisting of a first thermally hardening, highly reactive silicone that hardens at a first temperature can be applied onto the pre-heated substrate, wherein the bank encloses a surface or partial surface to be coated of the substrate, either as a whole or in part. Subsequently, the area or partial area of the substrate that is enclosed by the bank is completely or partially filled with a liquid second silicone, and the second silicone can be hardened. One, more or all parts of the optical system, for example lenses of a lens system of the primary optical system and/or the secondary optical system, can be manufactured by means of the first silicone and/or the second silicone. As regards further embodiments, reference can be made to DE 10 2010 044 470.

As an alternative or in addition, the optoelectronic module and/or parts thereof, for example the optical system and, more preferably, the primary optical system and/or the secondary optical system, can be manufactured as a whole or in part according to the method described in DE 10 2010 044 471. For example, a liquid silicone can, in particular, be potted into a mould that is open at its top and, particularly in at least one mould cavity, comprises outside dimensions that correspond to the outside dimensions of the substrate or are in excess thereof. Furthermore, the substrate can be introduced into the mould, wherein at least one of the optoelectronic components or, preferably, all of the optoelectronic components are fully immersed into the silicone and one surface of the substrate is in full contact with the silicone, or the substrate immerses into the silicone at least with a part of its full surface. Furthermore, the silicone can be hardened and cross-linked with the optoelectronic components and the substrate. Furthermore, the substrate provided with the coating consisting of the hardened silicone can be removed from the mould. The mould can, in particular, be designed such that, by means of the mould, for example, at least one mould cavity of the mould, the optical system or parts thereof, more preferably the primary optical system and/or the secondary optical system, is/are formed from the silicone either as a whole or in part.

In particular, a method can be utilized for manufacturing an optoelectronic module according to the present invention, said method being a method according to which the optical system or parts thereof is/are manufactured such that at least one formable starting material of the optical system, for example at least one silicone, can be brought into contact with the optoelectronic components and, preferably, with the substrate as well, and then formed and hardened. As regards potential embodiments of this method, reference can be made to the above description and, in particular, to the aforementioned prior art.

According to a further aspect of the present invention, a use of an optoelectronic module according to the invention is proposed for an exposure application and/or an irradiation application. As regards the possible embodiments of the optoelectronic module, reference can be made to the above description as well as to the following description of preferred embodiments of the optoelectronic module according to the invention. In particular, this application can be an application for irradiation using ultraviolet and/or visible and/or infrared light. In this exposure application and/or irradiation application, at least one workpiece is exposed to electromagnetic beams emitted by the optoelectronic module, wherein the workpiece may be a starting material and/or a workpiece that has already been molded. These electromagnetic beams can, for example, comprise light in the ultraviolet and/or visible and/or infrared spectral range. Preferably, this irradiation can be used for the purpose of drying and/or hardening and/or for the purpose of a photochemical modification of the workpiece or parts thereof.

The proposed method, the optoelectronic chip-on-board module and the optoelectronic device can be used advantageously in numerous manners. The embodiment according to the invention is to particular advantage in that it provides high flexibility with regard to different requirements of the particular purpose of use.

In this manner, it is for example possible to implement irradiation devices with a high radiation intensity according to chip-on-board technology. Since the spacings required between the LEDs (what is called pitch) are typically small, there are only a few known prior-art methods which can be utilized at all to implement beam-forming microlenses over the individual LEDs of an LED array by means of a potting material. Present methods practically neither allow taking targeted influence by adjusting a directivity, more particularly a directional characteristic, of the individual optical elements, for example of the individual microlenses and/or microoptical systems, in an array arrangement in front of the optoelectronic components, for example in front of the LED emitters and, optionally, also in the edge region. According to the invention, however, such set-ups can be implemented without any problems. It is, in particular, possible to implement primary microlens optical systems and/or secondary microlens optical systems for LED arrays, wherein the secondary optical systems can be optimally adjusted to the primary optical systems. The combination of this primary optical system approach with one or more secondary optical systems opens up new concepts for increasing the radiation intensity at significant working distances of >10 mm in relation to the light exiting window of the LED emitters.

By means of the proposed method, it is, in particular, possible to separately form individual lenses, more preferably microlenses, above one, more or all optoelectronic components, more particularly the LEDs of an LED array configuration. In this manner, it is, for example, possible to influence a directional characteristic of a complete LED array in a targeted manner, for example for the purpose of homogenization and/or beam focusing.

As has been described above, the proposed method can, in particular, be utilized for the manufacture of optoelectronic chip-on-board modules and systems which comprise at least one primary optical system and at least one secondary optical system. Therein, the primary optical system and/or the secondary optical system can be manufactured according to the invention either as a whole or in part by forming the primary optical system and/or secondary optical system in the silicone and/or the coating.

As regards their concept, prior-art systems with primary optical systems and secondary optical systems are generally known from other fields and can now be implemented and manufactured according to the invention. For example, the use of secondary optical systems is generally known for already packed LEDs (e.g. LEDs in an SMD housing). Furthermore, LEDs are used (assembled) in reflector housings and housings are enclosed with a potting material which comprises optical beam-forming properties, e.g. for forming the potting material to obtain lenses. Such housings are, in part, already available on the market.

In most housed LED products, however, the optical functionality of the housing comprises nothing but one beam-forming optical variant, either a reflector which is implemented by a depression into which the LED is inserted, or a lens wherein the LED is then usually set onto a flat substrate. Where necessary for these components, a further secondary optical system (lens or reflector or a combination of the two) is then set over the housed LEDs. For example, the aforementioned document U.S. Pat. No. 7,638,808 describes the use of microreflectors for LED arrays. Therein, use is made of a substrate which has cavities into which LEDs are inserted. Lateral walls of these individual cavities serve as reflector which can be adjusted in its design. The document also describes the use of an additional beam-forming potting process to close the cavities. This is therefore a combination of a primary microlens with a primary microreflector for individual LEDs in an array arrangement. Such known concepts which can only be implemented in a relatively complex manner when conventional methods are used can be implemented in a simple and reliable manner when the method proposed according to the invention is used.

According to the invention, it is furthermore possible to implement concepts featuring primary and secondary optical systems, in which use is made of one or more secondary optical systems which further collimate the light, for example of a plurality of light-emitting diodes each with assigned primary microoptical systems. For example, these optical systems can be set onto LED arrays, segments of LED arrays, photodiode arrays or segments of photodiode arrays, with the result that, for example, a secondary optical system contains a plurality of LEDs of an LED array with microoptical systems.

The invention can, in particular, be utilized in the field of irradiation technology and exposure technology, for example in industrial processes. In industrial processes, there is a multitude of LED exposure and irradiation applications, particularly in the ultraviolet and infrared spectral range. Here, numerous examples must be mentioned, such as drying of inks, the application of irradiation in the field of UV hardening, for example of adhesives, inks, colors, lacquers and potting materials as well as the use in exposure applications.

The present invention can, in particular, be used to easily meet the requirements typically applicable for irradiation applications. Therein, basic requirements usually are such that a high radiation intensity or a radiation intensity that has been adjusted to the particular application can be implemented in the wavelength range used, wherein typically radiation intensities of a few 10 $\mu W/cm^2$ up to several ten or a few hundred $W/cm^2$ can be implemented at an adjustable distance of typically a few millimeters up to one meter and more. At the same time, it should typically be possible to obtain certain light distributions that are required for the particular process. Therein, the light distribution can, for example, be a homogeneous field distribution in a certain process window or a narrow line. For example, current applications in the printing industry comprise the fields of ink-jet, sheet-fed offset, screen, gravure and flexo printing methods. Sheet-fed printing methods usually require high radiation intensities of 2-20 $W/cm^2$ at distances of 20-200 mm for ultraviolet LED light within a range of 360-420 nm.

Usually, the minimum requirement to be met by the radiation intensity required for the particular process also depends on the material. Where UV hardening (UV curing) applications are concerned, use is, for example, usually made of photoinitiators which, in most cases, do not allow a reaction that is sufficiently fast for cross-linking the monomers (polymerization) before a threshold value of the radiation intensity is exceeded, so that a good hardening result is achieved. Where, for example, surface hardening is concerned, polymerization is, herein, also inhibited by oxygen.

The basis for an efficient implementation of high-performance LED emitters which can comprise a plurality of LED chips and can have optical power rates of a few W up to several 10 kW and must, in addition, meet usually special requirements for the particular lighting profiles is a light output from a minimally required emission surface that is as high and efficient as possible. Efficient and compact emitters comprise emission surfaces of a few $cm^2$ up to a few hundred $cm^2$. Typically, this requires high packing densities which, where LED chips with surface areas of 1 $mm^2$ are concerned, may be 80 LED chips per $cm^2$, but are particularly and typically below 40 LED chips per $cm^2$ and, as a general rule, are up to 25 LED chips per $cm^2$. In order to reach such high packing densities and to be able to keep the high thermal loads which are incurred due to the typical efficiencies of UV LEDs in the range of 1-50% as low as possible, use can easily be made of optoelectronic chip-on-board modules according to the invention and optoelectronic devices according to the invention with a plurality of optoelectronic chip-on-board modules. For example, chip-on-board modules are currently developed which feature optoelectronic components in the form of chips having a surface area of 1.3×1.3 $mm^2$. Modules with chips with a chip area of up to several $mm^2$ can be expected from future developments.

Usually, light emitted by light-emitting diodes is divergent because of the directional characteristic that is typical of LEDs. Typically, modern LEDs are surface emitters which radiate into the half-space and usually have the directional characteristic of a Lambertian emitter. This divergent directional characteristic results in a heavy dependence of the radiation intensity on the working distance, i.e. for example on the distance between the object to be irradiated and the optoelectronic chip-on-board module, more particularly the LED emitter. According to the invention, however, the light emitted by LEDs in an LED array configuration can be utilized efficiently and the radiation intensity that can be implemented is high even at long working distances. It is, in particular, possible to implement adjusted optical systems which, on the one hand, can maximize the output of the light from the optoelectronic chip-on-board modules, more particularly the LED chips, and, on the other hand, can generate a high radiation intensity and a defined field distribution at a specific working distance.

If working distances are very long, for example working distances of at least 20 mm, the emitted light can, in particular, be collimated to a high extent. Usually, however, the use of a primary optical system without any further optical systems is limited because the LED cannot be considered a point light source in case of the microlens optical system. This is particularly due to the fact that the size of the lens which typically comprises a diameter of 1-10 mm and the size of the LED which typically comprises an edge length of 1 mm are comparable. For this reason, it is normally not possible to collimate the light completely; what is more, the efficiency of the lens decreases with increasing collimation, caused by reflection losses in the lens. To reach an optimized solution when radiation intensity and working distance requirements are very high, it is therefore, for example, possible according to the invention to implement at least one additional secondary optical system in addition to the at least one optimized primary optical system in order to achieve a high collimation or even focusing of the light and to maximize the system efficiency.

In particular, it is possible to implement at least one secondary optical system which is designed in the form of a reflector optical system with at least one reflector or in the form of a combination of at least one reflector optical system and at least one lens optical system. In this combination, the light that cannot be collimated directly through the primary optical system and into the irradiation area can, for example, be "collected" by the reflector and diverted into an irradiation area. In an implementation according to the invention, a primary optical system can furthermore be optimized to be in line with a secondary optical system and vice versa, with the result that the primary and secondary optical systems can be adjusted to each other.

According to the invention, use can be made of at least one optical system, particularly for influencing a directivity, more particularly a directional characteristic of the light emitted by the LEDs. As has been described above, the optoelectronic chip-on-board module according to the invention and/or the system according to the invention can, accordingly, comprise at least one optical system wherein a distinction is made between a primary optical system and a secondary optical system. For example, the primary optical system can comprise a lens array made of a transparent potting material which can be directly applied onto the substrate that is fitted with the optoelectronic components, for example the LEDs, for example by means of a method according to the invention, with the result that the primary optical system can, for example, be permanently connected to the LED chips. For example, a UV-stabilized, thermally hardened silicone can be used as starting material for manufacturing the primary optical system and/or the secondary optical system or parts thereof, for example for UV LEDs. As an alternative or in addition, it is also conceivable to use other materials, for example light-curing acrylates, PMMA, polycarbonate or other materials or combinations of the materials mentioned and/or other materials.

According to the invention, numerous optically functional geometries can be implemented as optical elements of the primary optical system and/or the secondary optical system, for example lens forms and/or scattering forms. These geometries can be adjusted to the radiation intensity profiles required for generating the particular applications. The only forms that are difficult to implement with casting methods are forms with a significant undercut because usually these methods are pouring methods. However, forms that can be easily implemented and used according to the invention are selected from: spherical lens optical systems, particularly in the form of cylindrical and/or rotationally symmetrical optical systems of both symmetrical and asymmetrical shape; aspherical optical systems, particularly in the form of cylindrical and/or rotationally symmetrical optical systems of both symmetrical and asymmetrical shape; free-form optical systems, particularly in the form of cylindrical and/or rotationally symmetrical optical systems of both symmetrical and asymmetrical shape; Fresnel optical systems, particularly in the form of cylindrical and/or rotationally symmetrical optical systems of both symmetrical and asymmetrical shape; polygonal and/or faceted optical systems, particularly in the form of cylindrical and/or rotationally symmetrical optical systems of both symmetrical and asymmetrical shape; rough structures, for example for light scattering or for statistically distributed light diffraction; structures with a structured surface. Combinations of the forms mentioned and/or other forms are feasible just as well.

The option of implementing a primary optical system offers a plurality of functions and advantages. For example, at least one lens can, in particular, be positioned directly above an optoelectronic component, for example directly above an LED. Contrary to a lens in the usual sense, the lens thereby has only an exit side and no entrance side because the light exiting from the light-emitting diode can directly enter into the material of the lens. This results in an increase in the output efficiency of the light from the LED or from the system, not only because the light has to pass one interface less and the adjustment of the refractive index between the LED and the potting material leads to a reduction in the internal total reflection inside the LED, but also as compared with the total reflection in case of plane potting.

Due to the geometry of the lens, it is furthermore possible to minimize reflection losses at an interface between the potting material and the air in a targeted manner. As compared with plane potting, this produces, for example, a further increase in efficiency. Where silicone is concerned, an increase in the output efficiency by a factor of approx. 2 is usually possible as compared with plane potting.

By using an appropriate primary optical system and/or secondary optical system, a beamforming that is adjusted to the set targets can be generated for each individual optoelectronic component, for example for each individual LED, with the result that the geometry of the optical system, for example the lens geometry, can be optimized while taking the direct guidance of the light into the target irradiation area into account, both with respect to the output efficiency and to the adjustment to the properties of a secondary optical system.

From a spatial point of view, lens surfaces can, furthermore, be arranged very close to, for example at a distance of less than 1 mm from, the optoelectronic components, for example the LEDs. As a result, the light of a large solid angle range, particularly up to a solid angle range of more than 70°, can, for example, be utilized; this can generate an increase in efficiency and allow high power densities.

Furthermore, the potting or coating, particularly the silicone potting, protects the optoelectronic components, more particularly the LEDs, against outside influences, such as dirt, moisture and mechanical influences.

Furthermore, the potting material usually has a higher refractive index than air. Typically, the refractive index of the potting material is n>1, for example n=1.3-1.6. For this reason, the refractive index is usually adjusted between the semiconductor material of the optoelectronic components, more particularly the LED chips which typically have a refractive index of n=3-4, and the potting material. This improves the light output from the optoelectronic chip-on-board module and has a positive effect on the total efficiency.

As an alternative or in addition to the use of one or more lenses in the primary optical system, the primary optical system can, furthermore, comprise one or more reflectors. For example, the primary optical system can comprise a microreflector array wherein, for example, each optoelectronic component, for example each LED, can be arranged in a small cavity the reflecting walls of which form the microreflector. A primary optical system in the form of an array comprising, for example, a combination of at least one microlens and at least one microreflector is also feasible.

An analogy, it is also possible to implement the at least one secondary optical system, for example in the form of one or more refractive elements, for example one or more lens elements, and/or in the form of one or more reflective elements.

The requirements to be met by the emitted light can also vary depending on the application process. If, for example, use is made of an arrangement of substrates or mounts in a continuous process, it is usually important to implement a homogeneous and intensive radiation intensity transversely to the running direction whereas, in running direction, it is usually and essentially important to maximize the dose rate to be applied. In practice, this means for example in case of a line emitter, that it may be advantageous to position the LEDs very close, for example at a distance of 0.05-5 mm, to each other in one spatial direction whereas, in the spatial direction that is orthogonal thereto, it may be more reasonable to increase the spacing between the LEDs, for example to more than 1 mm in order to obtain, for example, space for an efficient collimating primary and/or secondary optical system in this manner. In contrast, it will usually be advantageous to have a uniform distribution of the optoelectronic components, for example a uniform LED distribution, to implement a plane emitter which is intended to illuminate an area in a homogeneous manner.

According to the invention, it is generally possible to implement, in particular, identical geometries or different geometries for the primary optical system and/or the secondary optical system, wherein the geometries may even be different in a position-dependent manner. For example, it is possible to implement spacings between the optoelectronic components, for example the LEDs, and/or the microlenses in one or both spatial directions within an array. It is therefore possible to consider and utilize a distribution of the optoelectronic components and/or a distribution of the elements of the primary optical system and/or secondary optical system, for example a microlens distribution, in the development of an efficient assembly part, for example an efficient LED emitter.

Furthermore, it is also possible to variably adjust a structural size of the primary optical system and/or the secondary optical system, for example a structural size of the lenses of the primary optical system and/or the secondary optical system, for example to the particular application. Therein, there are various options that can be implemented, either separately or in combination. The optoelectronic components, for example the LEDs, and components of the primary optical system and/or the secondary optical system, for example the lenses, can comprise comparable structural sizes. For example, this can mean that each optoelectronic component, for example each LED, has an associated element of the primary optical system and/or the secondary optical system, for example an associated lens. Therein, the maximum structural size of the elements of the primary optical system and/or the secondary optical system, for example the maximum structural size of the particular lens, usually is limited by the pitch of the optoelectronic components, for example, the LEDs.

As an alternative or in addition, it is furthermore possible to implement embodiments in which the structural size of single, more or all optoelectronic components is less than the structural size of the optical system, for example the primary optical system. It is, for example, possible to implement embodiments in which the structural size of the LED is less than that of the associated lens. For example, this can mean that a lens and/or another component of the primary optical system and/or the secondary optical system can extend across a plurality of optoelectronic components, for example across a plurality of LEDs.

As an alternative or in addition, it is furthermore possible to implement embodiments in which the structural size of single, more or all optoelectronic components is greater than the structural size of the optical system, for example the primary optical system and/or the secondary optical system. It is, for example, possible to implement embodiments in which the structural size of the LED is greater than that of the lens. For example, this can mean that a plurality of elements of the primary optical system and/or the secondary optical system, for example a plurality of lenses or a lens array, can be positioned in front of an optoelectronic component, for example in front of an LED.

Within an array, the proportions of the structural sizes of the optoelectronic components and/or the optical system can, furthermore, vary in one or both spatial directions. For example, the proportions in both spatial directions can be identical or different or may change in their course.

As has been described above, the optical system can comprise scattering, collimating or focussing functions. For example, a lens function of the primary optical system can be provided, which is adapted such that it is scattering, collimating or focusing. If nothing but a primary optical system is used, it is usually advantageous to adapt it such that it is collimating or focusing. If, however, a reflector is used as secondary optical system, it can be appropriate, for example with regard to the efficiency and functionality of the overall system, to adapt the primary optical system such that it is scattering in order to utilize the reflector as best as possible.

A distance between the optoelectronic component, for example the LED, and the primary optical system, usually also decides upon the percentage of the light, for example the light emitted by the LEDs, which can be influenced by the primary optical system, more particularly the lenses, and upon the effect on this light. The distance can also be decisive for whether the light is scattering or collimating. Within an array, the distance between the optoelectronic component, for example the LED, and the lens can be equal or variable. If the lens size is predetermined, an acceptance angle—which is also referred to as numerical aperture NA—of the lens can depend on the distance from the optoelectronic components, for example the LED. Light that is emitted outside this acceptance angle is scattered and/or refracted (the latter in an uncontrolled manner) at the edges of the lens or the neighboring lenses, with the result that this light must be rated as lost. For this reason, the distance between the optoelectronic component, for example the LED, and the surface of the primary optical system can be relevant.

Furthermore, the size of the solid angle in which the primary optical system and/or the secondary optical system can have an effect on the optical path of the emitted or impinging light, for example the light emitted from the LEDs into the half-space, usually is a relevant measure for the efficiency of the optical system. In order to increase this efficiency, the optically active base surface of the optical system that is available should therefore be maximized in most cases. A measure that can be implemented according to the invention can be to take rectangular or polygonal base and sectional areas into account instead of easily formable round base areas and rotationally symmetrical horizontal sectional areas, wherein the former utilize the areas available between neighboring optoelectronic components, for example between neighboring LEDs, to a maximum extent. In case of an array with equal pitch in both spatial directions, this corresponds, for example, to a square base. When the base area that is, for example, square is utilized to the maximum extent, the optically active area can be maximized, which can result in an increase or even a maximization of the efficiency.

The surface of the primary optical system can be smooth, roughened or structured otherwise wherein, in the latter case, the surface can, for example, also be provided with a Fresnel optical system. If the surface is smooth, there is, for example, usually no effect on the actual lens action. In case of targeted shaping, for example a collimation, this surface allows achieving the highest efficiency in most cases. In case of a roughened and/or microstructured structure, an additional scattering effect is usually added to the actual lens action.

If lenses are used in the optical system, for example the primary optical system, these lenses can be aligned with the associated optoelectronic components in various manners. For example, a lens centre of a lens of the primary optical system can be aligned with an assigned optoelectronic component, for example with an LED, in a centralized or decentralized manner. Therein, a decentralized arrangement, for example in the umicrometer range to the millimeter range or above, can be equal for all lenses in a targeted manner or also be displaced in a sliding manner. By means of such displacements, a light cone that is formed by the primary optical system can, for example, be slanted. As a result, what is called a squinting effect can, for example, be achieved to increase the radiation intensity in the centre in front of the LED array, for example by directing the light cones of the LEDs disposed at the edge to the centre by such a relative displacement. But a statistically distributed relative displacement within an LED array can also be used to homogenize the light.

As has been described above, the optical system comprises at least one primary optical system and at least one secondary optical system. For example, the secondary optical system can comprise at least one reflector and/or at least one lens, wherein the elements mentioned can be arranged separately or also in an array. For example, the secondary optical system can comprise a reflector array and/or a lens array. Especially if distances are long, the only light contributing to illumination when nothing but the primary optical system is used usually is the light of a relatively small solid angle range. The secondary optical system allows utilizing the light of an increased solid angle range as well, so that the efficiency of the overall system can be increased. This allows achieving two effects or a mixed effect from both effects. For example, the secondary optical system can be significantly improved by focusing the light. This is to advantage in that the maximum radiation intensity can be increased while the number of the optoelectronic components, for example the number of LEDs, remains the same. If the maximum radiation intensity is to be kept at the same level, the number of the optoelectronic components, for example the number of the LEDs, can be reduced because the available light can be utilized more efficiently by the secondary optical system.

For example, the primary optical system can also be combined with at least one reflector and/or at least one further lens array as secondary optical system. Usually, this allows further transforming the field distribution generated by the primary optical system. For example, this allows achieving an improved focusing in order to increase the maximum radiation intensity in this manner.

Depending on the application process, the secondary optical system can also be adapted such that it acts in one or both spatial directions. In case of a line emitter, this can, in practice, mean for a continuous process that the secondary optical system can be arranged orthogonally to the running direction and serve to increase the dose rate and the maximum radiation intensity in running direction. In a plane emitter, the primary optical system can, for example, also be designed as a grid or, in a line emitter, as line (reflector) profiles extending in parallel to each other. This can mean that the structural size of the secondary optical system can also be adjusted in a variable manner. Therein, a plurality of options can be implemented:

a. The primary and secondary optical systems have comparable structural sizes.

b. The structural size of the primary optical system is less than that of the secondary optical system.

c. The structural size of the primary optical system is greater than that of the secondary optical system.

Inside the emitter, the proportions of the structural sizes in both spatial directions can be identical or different or may change in their course.

In order to be able to serve different process fields, mounts, more particularly substrates, that are adjusted in their size can be designed. In order to keep costs and efforts on a low level, however, it is usually reasonable to mount identical substrates, for example with a surface of 1 cm$^2$ or greater, side by side. It is therefore possible to implement a modular structure of the system according to the invention, for example the LED system, and of the optical concept. There is again a plurality of variants with regard to this implementation as well. For example, two or more optoelectronic chip-on-board modules according to the invention can be mounted side by side in one spatial direction or in two spatial directions. One, two or more optoelectronic chip-on-board modules can be potted at the same time. For example, the potting can be applied onto the mount, for example the substrate, without any lateral projection, with the result that substrates can be mounted side by side without any gap.

For example, one or more optoelectronic chip-on-board modules and/or their substrates and/or one or more devices according to the invention can, furthermore, be arranged on one or more heat sinks, or one optoelectronic chip-on-board module and/or a device according to the invention can comprise one or more heat sinks. For example, one or more chip-on-board substrates with LEDs can be disposed on a heat sink/mount. For example, at least one heat sink can be potted in the potting process, with the result that, for example, all substrates disposed thereon can be potted at the same time. It is also conceivable to pot a plurality of heat sinks, which may function as a module base, jointly at the same time.

Therein, a modularity of the secondary optical system can, in general, also correspond to a modularity of the optoelectronic components, for example to a modularity of the LED array, with the result that, for example, an array of optoelectronic components, for example an LED array, is provided with a secondary optical system module.

If one or more secondary optical system modules are provided, they can be greater or less in size than an array of the optoelectronic components, for example than an LED array, with the result that, for example, a secondary optical system module can be positioned over two, three or more arrays of optoelectronic components, for example LED arrays, that are arranged side by side. In the opposite case, two, three or more secondary optical system modules can, for example, be required for each array of the optoelectronic components, for example for each LED array.

With regard to the spacing between the optoelectronic components, an optional side-by-side mounting of optoelectronic chip-on-board modules and/or substrates thereof, for example in a system according to the invention, and/or a side-by-side mounting of secondary optical systems can be such that the pitch is maintained, i.e. immediate side-by-side mounting, or such that the pitch is not maintained, i.e. side-by-side mounting with an intermediate space.

Within an optoelectronic chip-on-board module or a system, for example within an LED emitter, use can be made of secondary optical systems that are differing in their form. For example, reflectors reflecting the light, for example, at an angle to a centre in front of the emitter, for example similarly to the aforementioned "squinting" primary optical system, can, for example, be used at the edge of an optoelectronic chip-on-board module, more particularly at the edge of an LED emitter. Therein, the central reflectors can also reflect the light to the centre in front of the emitter.

Furthermore, different secondary optical systems can be used depending on the position, for example, at least one reflector, at least one lens or at least one combination of at least one reflector with at least one lens. As an alternative, secondary optical systems can also be completely done without, depending on the position.

Altogether, it is possible to implement optoelectronic chip-on-board modules according to the invention which, preferably, have at least one primary optical system that only comprises an exit side. In this manner, reflection losses on an entrance side can be avoided. Furthermore, it is possible to use a shape, for example the use of an optical form of a lens, which can reduce reflection losses. A beamforming that is adjusted to the set targets can be generated for each individual optoelectronic component, for example for each individual LED. By having the option of arranging the optical system close to the optoelectronic components, for example of the lenses to the LEDs, the light of a wide solid angle range can be utilized.

Furthermore, the optoelectronic components, for example the LEDs, can be provided with a protective transparent potted coating that is UV- and temperature-stabilized. In this manner, it is particularly possible to also improve a long-term stability, and new fields of application can be developed due to an increased tightness to moisture and other environmental effects.

Since it is possible to variably adjust the spacing between the optoelectronic components, for example between the LEDs, in one or both spatial directions, the light output available can still be adjusted to the respective requirements. For example, many LEDs can be arranged in a confined space, or it is possible to arrange a comparatively lower number of LEDs to generate space for a specific optical system.

Due to the different potential structural sizes of the elements of the primary optical systems, for example the lenses of the primary optical system, the available light output can be used efficiently. For example, a lens function of the primary optical system can be provided, which is adapted such that it is scattering, collimating or focusing, just as required. For example, the surface of the primary optical system can be adapted such that it is smooth, roughened or structured otherwise, just as required.

Since it is possible to displace the elements of the primary optical system in relation to the assigned optoelectronic components, for example, by displacing the lens of the primary optical system in relation to the LED, a beam cone can be slanted (squinted), as has been described above.

By using one or more optional secondary optical systems, the efficiency of the optoelectronic chip-on-board module and/or the efficiency of the system can be significantly increased. In particular, this allows "recycling" of divergent light. In this manner, it is, for example, possible to achieve higher radiation intensities and/or to save optoelectronic components, more particularly LEDs.

A further advantage of the present invention is the possibility of implementing a high modularity. It is, for example, possible to implement optoelectronic chip-on-board modules each having one or more one- or two-dimensional arrays of optoelectronic components, wherein these arrays can be designed identically. A plurality of such optoelectronic chip-on-board modules, in particular having identical arrays of the optoelectronic components, can be mounted side by side in one or two spatial directions. The identity of the arrays of the optoelectronic components, for example of the LED arrays, can be advantageous for a simple and cost-effective production flow. In this manner, it is, all in all, possible to implement advantages with regard to an adjustment to different process geometries.

These individual advantages that can be implemented according to the invention or combinations of these advantages can directly increase the efficiency of the optoelectronic chip-on-board module and/or the system, for example the emitter. Thereby, it is, for example, possible to reach very high radiation intensities with simultaneously homogeneous radiation intensity distributions even at long distances. The aforementioned advantages can be combined in pairs or also with each other in any groups desired. The range of the options that can be implemented is therefore very wide whereby a plurality of requirements can be fulfilled.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 3 shows a further modification of an exemplary embodiment of an optoelectronic module with a plurality of primary optical elements per optoelectronic component, again without illustration of secondary optical elements;

FIGS. 4A and 4B show different alignments of the primary optical elements with the assigned optoelectronic components;

DETAILED DESCRIPTION OF THE INVENTION

Identical or like elements and/or corresponding parts are identified in the following figures through the same reference numbers such that there is no need to introduce each again in each case.

The invention will, in particular, be illustrated without any limitation to further potential embodiments by means of chip-on-board modules, i.e. by means of luminous elements, as an example of optoelectronic modules and, in particular, of chip-on-board modules. Within the scope of the invention, it is also possible to use photodiodes in solar cells or other components as optoelectronic components in the stead of LED modules.

Figure 1A:
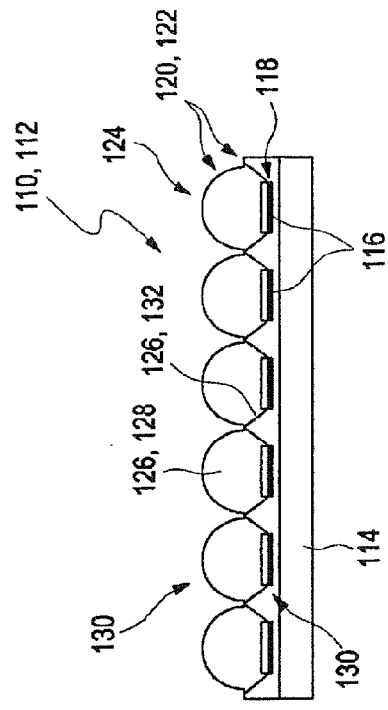
FIGS. 1A and 1B show exemplary embodiments of optoelectronic modules according to the invention, with illustration of the primary optical system and without illustration of the secondary optical system.

FIG. 1 shows a first exemplary embodiment of an optoelectronic module in a schematic sectional view from the side. Furthermore, a plurality of the shown optoelectronic modules 110 can be mounted side by side (which is not shown in FIG. 1A), so that this results in an optoelectronic device 112.

The optoelectronic module 110 comprises a substrate 114 which has a plane design, for example a flat design. For example, this substrate 114 can comprise a printed circuit board. Optoelectronic components 116, for example, light-emitting diodes and/or photodiodes, are applied onto the substrate, preferably in chip-on-board technology. Preferably, these light-emitting diodes and/or photodiodes are arranged in an array 118, for example in a one-dimensional or two-dimensional arrangement.

According to the exemplary embodiment shown in FIG. 1A, the optoelectronic module 110, furthermore, comprises an optical system 120 with a plurality of optical elements 122. The optical system 120 comprises a primary optical system 124 with a plurality of primary optical elements 126 which, in the exemplary embodiment shown, are designed as lenses 128, for example as microlenses. Furthermore, the optical system 120 comprises at least one secondary optical system which is not shown in FIG. 1A. As regards the embodiment of this secondary optical system, exemplary reference can be made to the exemplary embodiments shown in FIGS. 5 to 8.

For example, the primary optical elements 126 are applied to the substrate 114 as potted elements in a casting method. For possible embodiments of this method, reference can be made to the description above. Preferably, the primary optical elements 126 are designed in the form of an array 130.

Therein, FIG. 1A shows an exemplary embodiment in which a primary optical element 126 is assigned to each optoelectronic component 116. Therein, the optoelectronic components 116 and the primary optical system 124 have comparable structural sizes and the arrays 118, 130 preferably comprise equal pitches, i.e. equal spacings between the centre points of these elements.

Figure 1B:
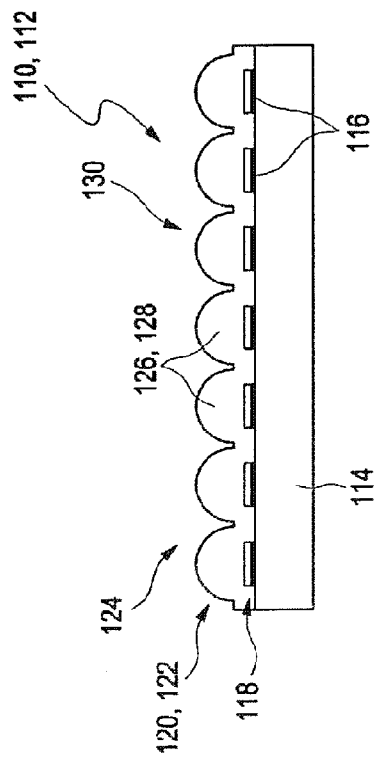

FIG. 1B shows a modification of the exemplary embodiment according to FIG. 1A. Again, an optoelectronic module 110 is shown, which can be an integral part of an optoelectronic device 112. The optoelectronic module 110 comprises a plurality of optoelectronic components 116 which can, for example, again be arranged in an array 118. Furthermore, the optoelectronic module 110 again comprises an optical system 120 with a primary optical system 124 and a plurality of primary optical elements 126. In contrast to the exemplary embodiment according to FIG. 1A, however, the primary optical elements 126 not only feature optoelectronic components 116 to each of which a lens is 128 is assigned, but the primary optical elements 126 also comprise a plurality of reflectors 132 wherein, in the exemplary embodiment shown, the reflectors 132 are designed in the form of depressions with reflecting lateral walls. For example, the depressions can be formed in the substrate 114 and/or in at least one coating applied to the substrate 114. By way of example, a reflector 132 is again assigned to each optoelectronic component 116 in FIG. 1B. As is the case with the lenses 128, the reflectors 132 can therefore also be arranged in the form of an array 130. As is the case in FIG. 1A, the structural size of the primary optical system 124 can again be comparable with the size of the optoelectronic components 116.

Figure 2A:
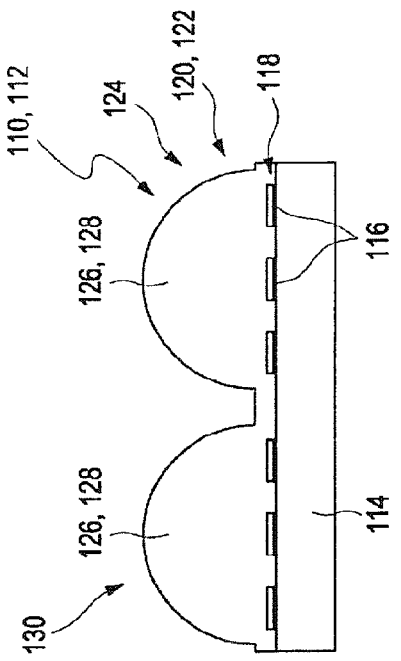
FIGS. 2A and 2B show modifications of exemplary embodiments of optoelectronic modules with a primary optical system, wherein a plurality of optoelectronic components are each assigned to primary optical elements, again without illustration of a secondary optical system.
Figure 2B:
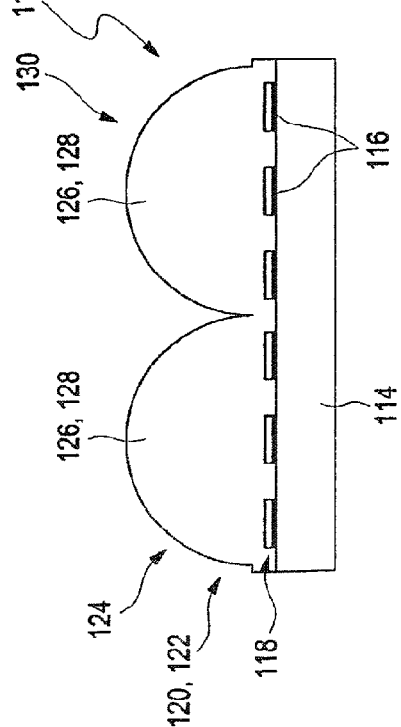

While, in the exemplary embodiments according to FIG. 1A, the assignment is such that the structural size of the primary optical elements 186 and therefore the pitch of the arrays 130 at least approximately corresponds to the structural size of the optoelectronic components 116 and the pitch of the array 118, respectively, FIGS. 2A and 2B show exemplary embodiments in which the structural size of the optoelectronic components 116 is less than the respective structural size of the primary optical elements 126 of a primary optical system 124. Otherwise, the illustration of these exemplary embodiments in FIGS. 2A and 2B corresponds to the illustration in FIGS. 1A and 1B. Therein, FIG. 2A shows an exemplary embodiment in which the array 118 of the optoelectronic components 116 comprises a constant pitch, wherein one primary optical element 126 in the form of a lens 128 is each assigned to three optoelectronic components 118 in the drawing plane shown in FIG. 2A. The pitch of the array 130 of the primary optical elements 126 therefore is a third of the pitch of the arrays 118 of the optoelectronic components 116. Thus, the exemplary embodiment in FIG. 2A can also be referred to as a pitch-maintaining exemplary embodiment. In contrast, FIG. 2B shows a modification of this exemplary embodiment in which there is a longer spacing between the optoelectronic components 116 in the centre of the optoelectronic module 110, with the result that, here, one can speak of a pitch-varying embodiment.

FIG. 3 shows a further modification of the exemplary embodiment according to FIG. 1A. In this exemplary embodiment, a plurality of primary optical elements 126 in the form of lenses 128 is assigned to each optoelectronic component 116. Accordingly, the structural size of the optoelectronic components 116, for example the light-emitting diodes, exceeds that of the lenses 128 of the array 130 of primary optical elements 126.

FIGS. 4A and 4B show details of further exemplary embodiments of optoelectronic modules 110 or optoelectronic devices 112. Therein, the exemplary embodiments in FIGS. 4A and 4B show different options of an alignment of the optoelectronic components 116 in relation to the assigned primary optical elements 126.

For example, an optical axis 134 can be assigned to each optoelectronic component 116, and an optical axis 136 can be assigned to each primary optical element 126. Therein, FIG. 4A shows an exemplary embodiment in which the optical axes 134, 136 coincide. In contrast, FIG. 4B shows an exemplary embodiment in which the optical axes 134 and 136 are offset in relation to each other. Therein, there may be a parallel offset, as is shown in FIG. 4B. As an alternative or in addition, the optical axes 134, 136 can, however, also be designed such that they are slanted in relation to each other. The relative alignment of the optical axes 134, 136 with each other can also be designed in a varying manner along the arrays 118 and 130, respectively. Due to the different embodiment of the alignment of the optical axes 134, 136, a directivity of the primary optical system 124 can also be dependent on a position on the array 130.

Figure 5:
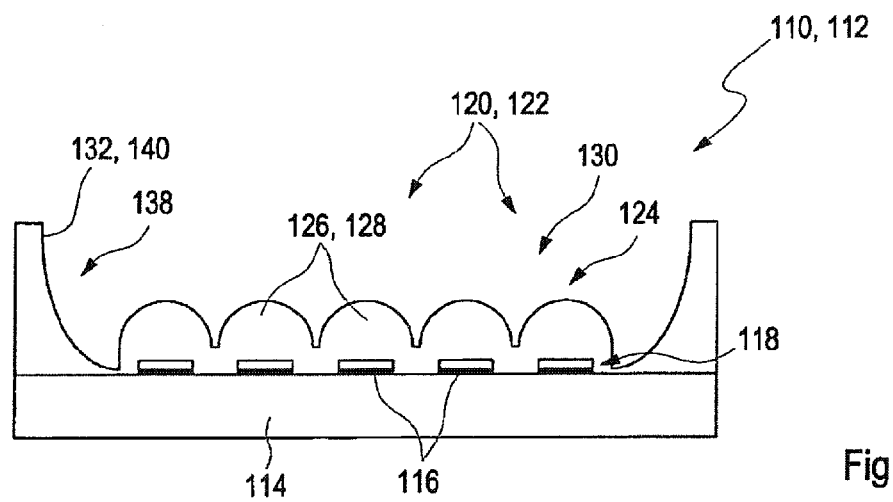
FIG. 5 shows a potential exemplary embodiment of an optoelectronic module with lens-shaped primary optical elements and a reflector as a secondary optical element.

FIG. 5 shows a first potential exemplary embodiment of an optoelectronic module 110 according to the invention. In the exemplary embodiment shown, this optoelectronic module 110 initially comprises a structure that is analogous with the structure according to FIG. 1A, with a plurality of optoelectronic components 116 and a primary optical system 124. A plurality of such optoelectronic modules 110 can, again, be mounted side by side to obtain an optoelectronic device 112. For a description of this structure, reference can first largely be made to the description of the exemplary embodiment according to FIG. 1A. The primary optical system 124 again comprises a plurality of primary optical elements 126 in the form of an array 130 of lenses 128. As an alternative or in addition, it is also possible to provide primary optical elements 126 in the form of reflectors 132, for example in analogy with the exemplary embodiment according to FIG. 1B. In the exemplary embodiment shown, however, the optical system 120 comprises a secondary optical system 138 in addition to the primary optical system 124. In the exemplary embodiment shown, this secondary optical system 138 comprises a secondary optical element 140 in the form of a reflector 132.

Figure 6:
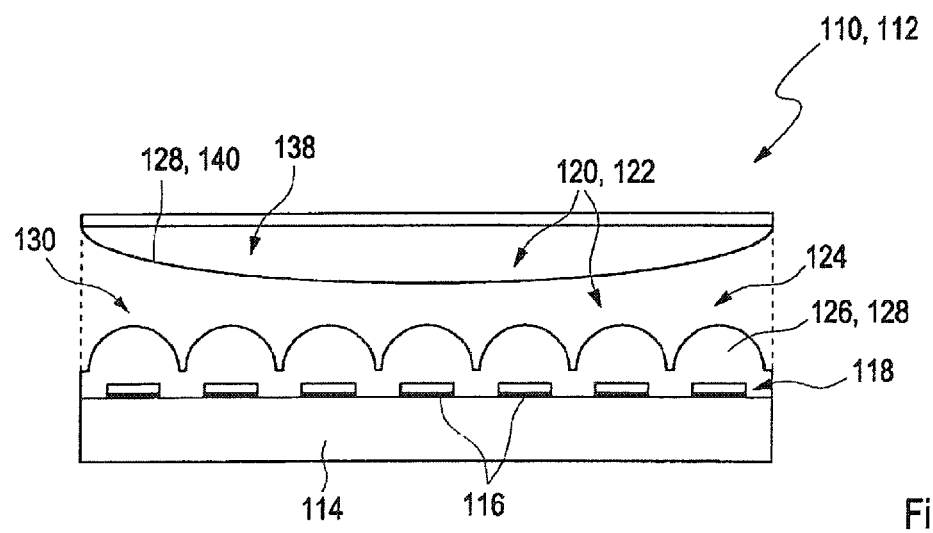
FIG. 6 shows an exemplary embodiment of an optoelectronic module with lens-shaped primary optical elements and a lens-shaped secondary optical element.

As an optional embodiment of the secondary optical system that can be implemented as an alternative or in addition, FIG. 6 shows an exemplary embodiment of an optoelectronic module 110 or, rather, a detail of an optoelectronic device 112, which can initially be designed in analogy with the exemplary embodiment in FIG. 5 or with the exemplary embodiment in FIG. 1A, as regards the primary optical system 124. Again, a secondary optical system 138 with a secondary optical element 140 is provided wherein, in contrast to the embodiment according to FIG. 5, however, the secondary optical element 140 in the exemplary embodiment shown is designed as a plano-convex lens 128. FIG. 6 indicates this secondary optical element 140 in the form of the lens 128 as a curved line at which the reference line ends. This line represents an interface at which the light can be refracted. The material of the lens 128 of the secondary optical element 140 can be disposed above this line. For example, at least one intermediate material can be disposed between the secondary optical element 140 and the primary optical system 124 with the primary optical elements 126, said intermediate material, for example, being selected from air, a liquid, a gas, a solid, a gel having a different refractive index than the refractive indices of the primary optical system 124 and the secondary optical system 138 or a combination of the materials mentioned and/or other materials. However, a different embodiment is also feasible, in which the secondary optical system 138, for example, directly rests on the primary optical system 124. The at least one lens 128 of the secondary optical system 138 can also comprise a plurality of lenses 128 which can, for example, again be arranged in an array.

Figure 7:
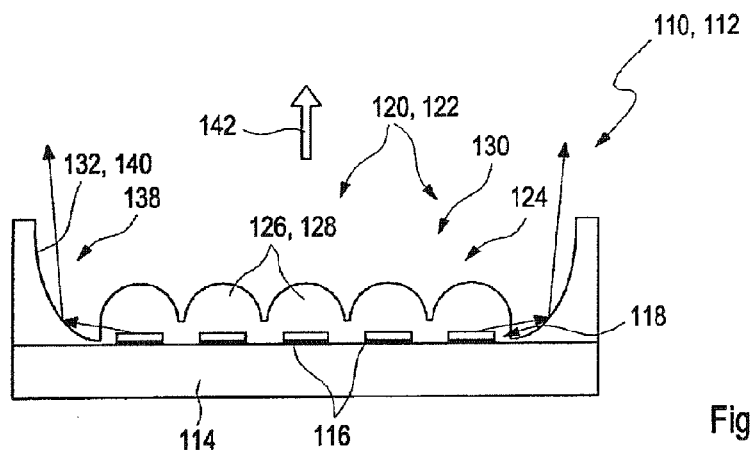
FIG. 7 shows an exemplary embodiment of a schematic optical path of the arrangement according to FIG. 5.

As has been defined above, the light emitted by the optoelectronic components 116, for example by the light-emitting diodes, initially passes the primary optical elements 126 of the primary optical system 124 before this light then passes the secondary optical elements 140. In this manner, the secondary optical system 138 is, for example, able to increase a useful solid angle range. This is illustrated in FIG. 7 by way of example of an optical path that is indicated schematically. This exemplary embodiment corresponds to the exemplary embodiment according to FIG. 5, with the result that reference can be made to the description of FIG. 5 with regard to the description of the individual components. Therein, FIG. 7 shows the beams of a light that is emitted by the optoelectronic components 116. These beams which are, here, illustrated by way of example of an optoelectronic component disposed at the edge initially pass the primary optical elements 126 and are then reflected by the reflecting surface of the reflector 132 of the secondary optical system 138 and collimated in an emission direction 142 of the optoelectronic module 110.

Figure 8:
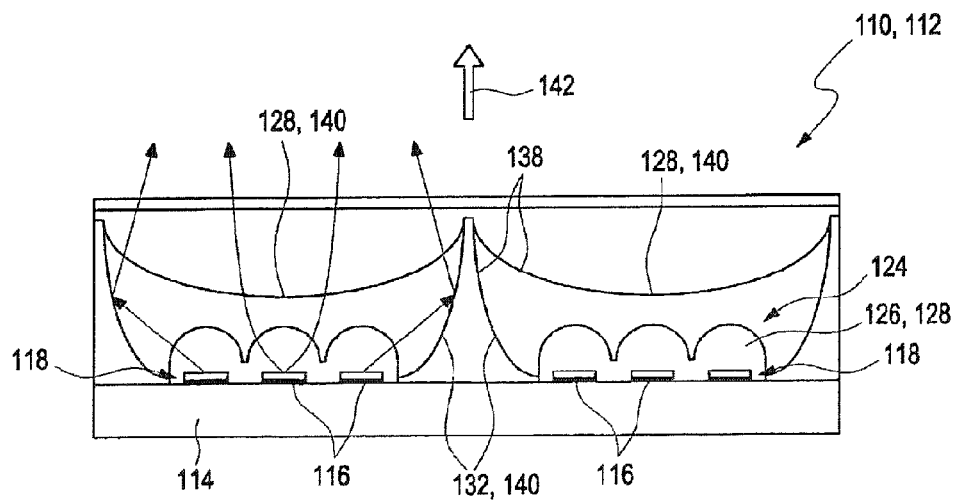
FIG. 8 shows an exemplary embodiment of an optoelectronic module with lens-shaped primary optical elements and a plurality of secondary elements in the form of reflectors and lens elements.

In analogous manner, FIG. 8 shows an exemplary embodiment with an exemplary optical path. Initially, this exemplary embodiment again shows optoelectronic components 116 which are applied onto the substrate 114 in one or more arrays 118. By way of example, two arrays 118 are provided in the exemplary embodiment shown. As a matter of principle, however, another embodiment is also feasible. In analogy with the embodiments, for example shown in FIGS. 5 and 7, a primary optical element 126 in the form of a lens is initially assigned to each optoelectronic component 116. In addition, a secondary optical system 138 is provided which comprises a plurality of secondary optical elements 140 in the exemplary embodiment shown. For example, one secondary optical element 140 in the form of a reflector 132 is provided per array. Furthermore, one further secondary optical element 140 in the form of a lens 128 is provided per array 118. The left one of the two arrays 118 shown furthermore shows an exemplary optical path. Light beams emitted by the optoelectronic components 116 are initially refracted for the first time by the primary optical elements 126. Subsequently, these light beams pass one or two secondary optical elements 140, for example in that these beams are first reflected by the reflector 132 and then refracted by the lens 128 or in that they are directly refracted by the lens 128 of the secondary optical system 138. In any case, a collimation in an emission direction 142 of the optoelectronic module 110 can be achieved for each of the arrays 118.

Figure 9:
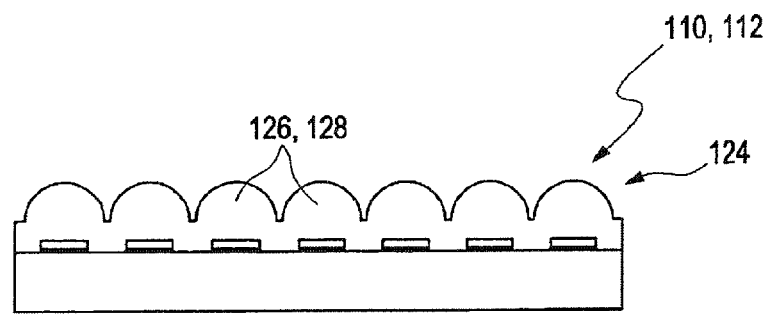
FIGS. 9 to 11 show different embodiments of a surface structure of optical elements in optoelectronic modules according to the invention.
Figure 10:
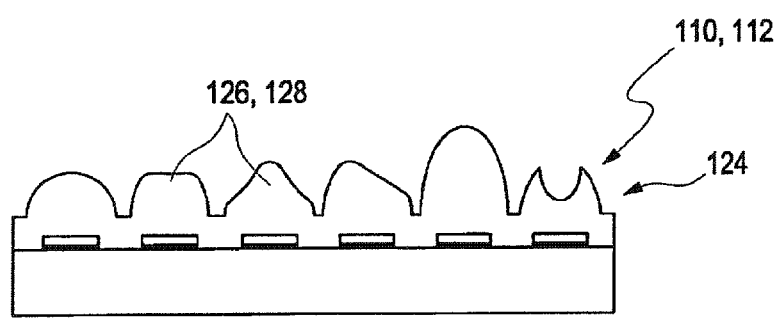
Figure 11:
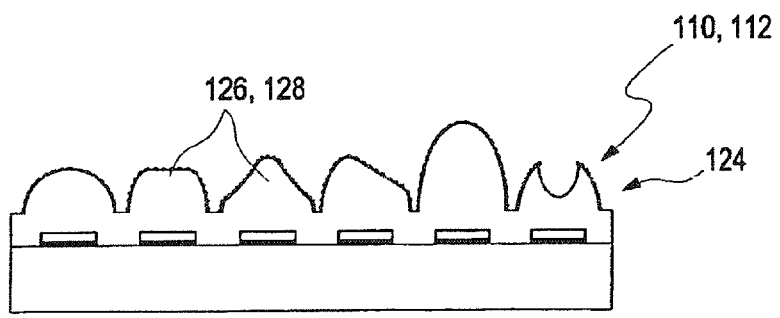

If a plurality of primary optical elements 126 and/or a plurality of secondary optical elements 140 are provided, these elements 126 and 140, respectively, can be designed similarly or differently. In particular, these elements 126, 140 can comprise a surface structure. Such a surface structure can, for example, be produced by means of an appropriate casting method, for example by using at least one mould which produces this surface structure in the casting method. As has been described above, this can, for example, be implemented within the scope of a silicone potting method. FIGS. 9, 10 and 11 show different exemplary embodiments of surface structures. By way of example, these figures again only show optoelectronic modules 110 with primary optical elements 126 wherein, as regards the embodiment of such optoelectronic modules 110, reference can be made to the above description, for example of FIG. 1A. As a matter of principle, however, the other exemplary embodiments of the present invention can also be provided with an appropriate surface structure at the primary optical system 124 and/or the secondary optical system 138.

FIG. 9 shows an exemplary embodiment in which similar lenses 128 are provided as primary optical elements 126. For example, these lenses 128 can be designed spherically or can, for example, comprise a smooth surface.

FIG. 10 shows an exemplary embodiment in which primary optical elements 126 are again provided in the form of lenses 128. However, this exemplary embodiment shows that the lenses 128 do not necessarily have to comprise a spherical surface and that, for example, non-spherical surfaces with differently curved areas can also occur. For example, primary optical elements 126 and/or secondary elements 140 can also comprise lenses 128 with differently curved areas wherein, for example, use can also be made of a combination of one or more convex areas with one or more concave areas. Therein, all lenses 128 of the primary optical system 124 and/or the secondary optical system 138 can have a design that is curved in the same manner or, as is indicated in FIG. 10 by way of example, in a different manner, with the result that there can, for example, be at least two lenses 128 which comprise differently curved surfaces.

By way of example, FIG. 11 shows a modification of the exemplary embodiment according to FIG. 10 such that, in addition to an appropriately designed surface curvature, it is also possible to provide texturing of a surface or structuring of a surface. For example, a roughening of the surface of the lenses 128 of the primary optical system 124 and/or the secondary optical system 138 can be provided. For example, these roughened areas can provide for scattering effects and/or help compensate inhomogeneities in an irradiation.

The exemplary embodiments shown in FIGS. 9, 10 and 11 can analogously be applied to a secondary optical system 138. For example, it is also possible to design secondary optical systems 138 with appropriately smooth surfaces, curved surfaces or structured surfaces.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An optoelectronic module (110), wherein the optoelectronic module (110) comprises a substrate (114), wherein the substrate (114) has a flat design, further comprising a plurality of optoelectronic components (116) arranged in a one or two-dimensional array on the substrate (114), wherein the optoelectronic module (110) further comprises at least one optical system (120) applied onto and in contact with the substrate (114), wherein the optical system (120) comprises at least one primary optical system (124), designed as a lens system, that is adjacent to the optoelectronic components (116) and at least one secondary optical system (138), the at least one primary optical system being formed, at least partially using a casting method, as a single structure covering the plurality of optoelectronic components on the substrate and including a plurality of primary optical elements, each of the primary optical elements being a lens, wherein a primary optical element is assigned to each optoelectronic component, each of the optoelectronic component and the primary optical element comprising an optical axis, wherein the optical axes can be aligned with each other in a manner selected from the group consisting of: the optical axes coincide; the optical axes are offset in parallel to each other; and the optical axes are slanted in relation to each other, alignment of the optical axes varying within the array, wherein the secondary optical system (138) comprises at least one secondary optical element (140), each secondary optical element being assigned to a plurality of optoelectronic components (116) and to a plurality of primary optical elements (126) of the at least one primary optical system, and wherein a directivity of the primary optical elements varies within the array (118), the variation of directivities being the result of at least one of the following:

(i) two or more primary optical elements in the array have surface curvatures that are different from each other, (ii) two or more primary optical elements in the array have a surface texturing that is different from each other, or (iii) at least one primary optical element in the array has an optical axis that is parallel to an optical axis of the corresponding optoelectronic element and at least one other primary optical element in the array has an optical axis that is slanted with respect to an optical axis of the corresponding optoelectronic element.

2. The optoelectronic module (110) according to claim 1, wherein the at least one optical system (120) is a microoptical system having a plurality of microoptical elements.

3. The optoelectronic module (110) according to claim 1, wherein the secondary optical element (140) comprises a reflector (132) having a depression with reflecting surfaces, wherein the optoelectronic components (116) assigned to the secondary optical element (140) are introduced into the depression.

4. The optoelectronic module (110) according to claim 3, wherein at least one primary optical element (126) assigned to the optoelectronic components (116) is additionally introduced into the depression.

5. The optoelectronic module (110) according to claim 1, wherein the secondary optical element (140) comprises a lens (128), wherein the lens (128) covers the optoelectronic components (116) assigned to the secondary optical element (140).

6. The optoelectronic module (110) according to claim 5, wherein at least one primary optical element (126) assigned to the optoelectronic components (116) is additionally covered by the lens (128).

7. The optoelectronic module (110) according to claim 1, wherein an array (118) of the optoelectronic components (116) are spaced apart from an edge of the substrate (114) by no more than 10 mm.

8. An optoelectronic device, comprising a plurality of optoelectronic modules (110) according to claim 1, wherein the optoelectronic modules (110) are mounted side by side in one or two spatial directions.

9. A method for manufacturing an optoelectronic module (110) according to claim 1, relating to an optoelectronic module (110), wherein the optical system (120) is at least partially manufactured particularly using the casting method such that at least one formable starting material of the optical system (120) can be brought into contact with the optoelectronic components (116) and then molded and hardened.

10. A use of an optoelectronic module (110) according to claim 1 relating to an optoelectronic module (110), for an exposure application and/or an irradiation application, wherein at least one workpiece is exposed to electromagnetic beams emitted by the optoelectronic module (110).

* * * * *